United States Patent [19]
Lepsche et al.

[11] Patent Number: 5,871,822
[45] Date of Patent: Feb. 16, 1999

[54] LOW EMISSIONS METHOD FOR SPRAY APPLICATION OF CONFORMAL COATING TO ELECTRONIC ASSEMBLIES

[75] Inventors: Thomas G. Lepsche; James M. Henz, both of Albuquerque, N. Mex.

[73] Assignee: Honeywell Inc., Minneapolis, Minn.

[21] Appl. No.: 721,514

[22] Filed: Sep. 26, 1996

[51] Int. Cl.$^6$ .............................. B05D 1/02; B05D 3/02; B05D 5/12
[52] U.S. Cl. ...................... 427/424; 427/385.5; 427/386; 427/387; 427/96
[58] Field of Search ............................. 427/96, 197, 424, 427/385.5, 386, 387

[56] References Cited

U.S. PATENT DOCUMENTS

| | | | |
|---|---|---|---|
| 3,652,333 | 3/1972 | Warren | 427/96 |
| 4,634,603 | 1/1987 | Gruss et al. | 427/96 |
| 4,880,663 | 11/1989 | Shimada | 427/96 |
| 5,266,349 | 11/1993 | Bok | 427/96 |
| 5,294,459 | 3/1994 | Hogan et al. | 427/96 |
| 5,510,138 | 4/1996 | Sanftleben et al. | 427/96 |

*Primary Examiner*—Shrive Beck
*Assistant Examiner*—Bret Chen
*Attorney, Agent, or Firm*—Andrew A. Abeyta; Kenneth J. Johnson

[57] ABSTRACT

An apparatus and method for applying a conformal coat to an electronic assembly which significantly reduces the emissions which are a by-product of the process. A spray gun atomizes a conformal coat/solvent mixture at a high pressure within the gun and then emits the mixture at a low volume and low pressure such that the transfer rate of the material is very high and the amount of wasted material is very low. The coats are applied in such a manner that the electronic assembly can be sprayed multiple times before sending the entire assembly into the curing oven.

11 Claims, 5 Drawing Sheets

DIRECTION OF MOVEMENT
OF ELECTRONIC ASSEMBLY 5,871,822

LOW EMISSIONS METHOD FOR SPRAY APPLICATION OF CONFORMAL COATING TO ELECTRONIC ASSEMBLIES

FIELD OF THE INVENTION

This invention relates to an apparatus and method for applying a conformal coat to an electronic assembly, and more specifically to an apparatus and method which applies this conformal coat in a low pressure and low volume manner.

BACKGROUND OF THE INVENTION

Typically, printed circuit boards that require protection from moisture, electric leakage, dust, and salt fog are coated with insulating films, known as conformal coatings. These conformal coatings are usually made up of such things as acrylic, polyurethane, silicone, or epoxy synthetic resins dissolved in a volatile solvent. When applied to clean circuit boards, an insulated resin film of uniform thickness and without pinholes, is formed as the solvent evaporates.

Numerous methods currently exist for applying coatings of the moisture-proof insulating material to printed circuit boards. A first method is immersing the printed circuit board in an immersion tank containing the insulating material. In a second method, the insulating material is applied to the electronic assembly by a brush. In a third method, a sheep's wool roll impregnated with insulating material is rolled on to the surface of the electronic assembly. In a fourth method, an assembly with pressurized nozzles applies the insulating material to the circuit board. Finally, in a dye method, the insulating material is pressurized and extruded from a slit dye to eject a film for coating the printed circuit board surface.

Spraying is the most commonly used insulating coating method employed in mass production. Spraying can be categorized as either air spraying in which an air stream is impinged against a stream of liquid coating material after leaving the spray nozzle to atomize it, and airless spraying in which the coating material is dispensed in a low pressure, unatomized film pattern.

One traditional approach for application of solvent based conformal coating materials to electrical assemblies for environmental protection has utilized conventional high pressure commercial or industrial spray equipment. In one configuration, an automated spray booth operating six industrial spray guns is used to apply conformal coating to the surface of the assembly as it passes through on a conveyor. In this process, a mixture of conformal coat and thinner/carrier is fed by a positive displacement pump to the spray heads which atomize the solution and apply it directly to the assembly. Due to the design of the spray heads used in this equipment, low volume with high atomization pressure, a low viscosity fluid, i.e., low solids and high solvent content, must be used in order to atomize the solution as it exits the fluid nozzle. The atomization pressure and therefore, high spray velocity, along with the high solvent concentration causes a great deal of overspray and a high transfer loss effect due to particles rebounding from the surface to be coated. A direct result of this phenomenon are low solid transfers to the surface, chemical waste, and high emissions.

All companies which apply conformal coatings in the United States must comply with Environmental Protection Agency (EPA) requirements. These requirements set a limit on the hazardous air pollutants that the company emits during a year. Local air quality regulations set a limit on the maximum amount of volatile organic compound emissions from the plant, as well as limit the hydrocarbon ambient air quality on the property line of a facility. Compliance with these regulations can be quite expensive and time consuming. One method of complying with these regulations is to simply employ the spraying operation less often. This can be a major disadvantage when trying to meet a delivery schedule and there is not enough time to get the product out. Another alternative is to install an exhaust scrubber system. This can prove to have a very large up front cost and require significant yearly maintenance. A final solution is to change the type of volatile organic compounds used. This also has a very high implementation cost and adds significantly to the yearly material cost, because the different characteristics of the new materials require extensive study to prove that they are adequate.

Therefore, the object of the present invention is to develop a method and apparatus which allows for the application of conformal coat to electronic assemblies while reducing the amount of materials wasted and complying with the environmental regulations.

SUMMARY OF THE INVENTION

Disclosed herein is a method and apparatus for applying a conformal coat to an electronic assembly. The apparatus for applying the conformal coat includes a conveyor belt for moving the electronic assembly in a predetermined direction at a predetermined speed. At least one spray gun applies the conformal coat to the electronic assembly by atomizing the conformal coat and a solvent within the gun at a high pressure and then spraying the mixture over the electronic assembly at a low volume and low pressure rate. The gun is moved relative to the conveyor belt and electronic assembly such that the electronic assembly receives a uniform coat of the mixture. After the desired thickness of the mixture has been applied to the electronics assembly, it then passes through an oven which evaporates the solvent portion of the mixture so only the conformal coat remains.

One gun is sufficient to cover one side of the electronic assembly. In order to cover all the exposed edges of the electronic assembly, two guns are mounted at angles to each other and the conveyor so that during the movement of the guns all surfaces are coated.

The high air pressure atomization of the mixture in the gun guarantees that the mixture is fully atomized. The spraying of the mixture at a low volume and low pressure allows the majority of the material to stick to the electronic assembly and not rebound off to accumulate in the chamber or be exhausted into the atmosphere. While the mixture is emitted at a lower volume and lower pressure, a much higher percentage of the mixture's conformal coat sticks to the electronic assembly than any of the prior art methods so the method and apparatus disclosed does not require any additional time to perform the process.

DESCRIPTION OF THE PREFERRED EMBODIMENT

Figure 1:
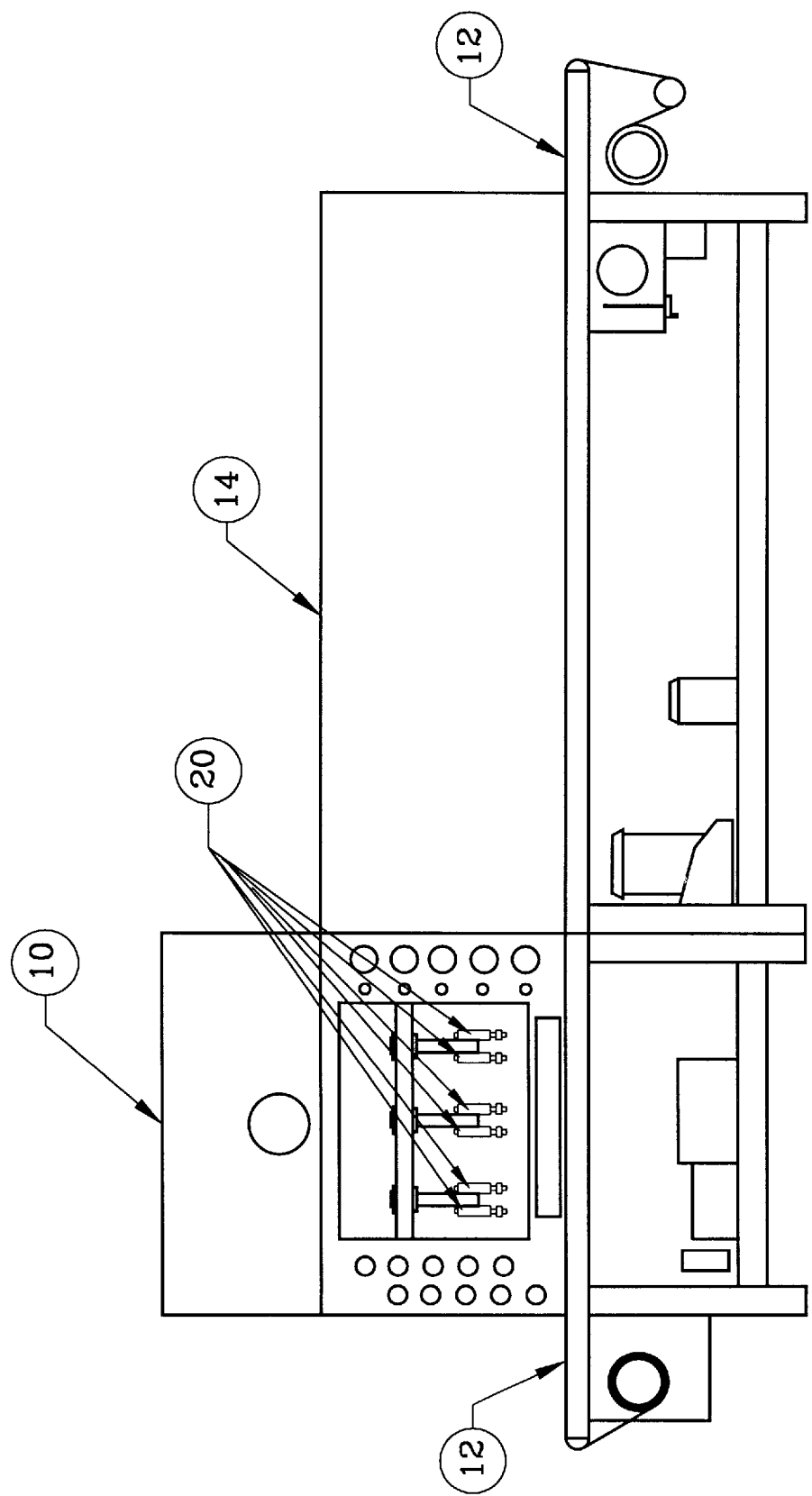
FIG. 1 shows the prior art apparatus for applying the conformal coat to the electronic assemblies.

FIG. 1 discloses a prior art apparatus for applying a conformal coat to an electronic assembly. The electronic referred to recited herein is most commonly a circuit card assembly, but one skilled in the art would realize that process and apparatus for applying a conformal coat described herein can be used for any electronic assembly which requires a moisture-proof coating. In the prior art apparatus, a conveyor belt 12 moves the electronic assemblies through the spraying chamber 10. While in the spraying chamber, high pressure spray guns 20 move back and forth over the electronic apparatus and apply a mixture of conformal coat and solvent. The movement of the conveyor belt 12 is timed with the movement of the spray guns 20 so that by the time the electronic assembly passes by all the spray guns, it has received a uniform coat of the conformal coat/solvent mixture. At this point the electronic assembly passes into the oven 14 where it is heated and the solvent is evaporated, leaving only the protective conformal coat. This coat has been applied such that there should be no pinholes or other openings in the coating to allow moisture to affect the operation of the electronic assembly.

The disadvantage of the prior art apparatus shown in FIG. 1 is that the spray guns 20 spray the conformal coating/solvent mixture at such a high pressure upon the electronic assembly that the majority of the mixture rebounds off the electronic assembly and is passed out of the production facility through the exhaust fan or accumulates on the inside of the coating chamber 10. The spray guns in this prior art apparatus required six high volume, high pressure industrial sprayers. The mixture is sprayed at such high pressures and high volumes because in the typical spray gun., the conformal coat/solvent mixture is atomized outside of the gun. An additional requirement is that the solids-to-liquid ratio in the mixture be approximately 7.9%. The sprayers emit the coating/solvent mixture at about 22 psi with a transfer rate of the material of approximately 40%. Each electronic assembly must be cured in the oven 14 after each pass through the coating chamber 10. In order to get a thickness of 1.5 mils on all sides, the assemblies receive two passes through the spray booth.

Figure 2:
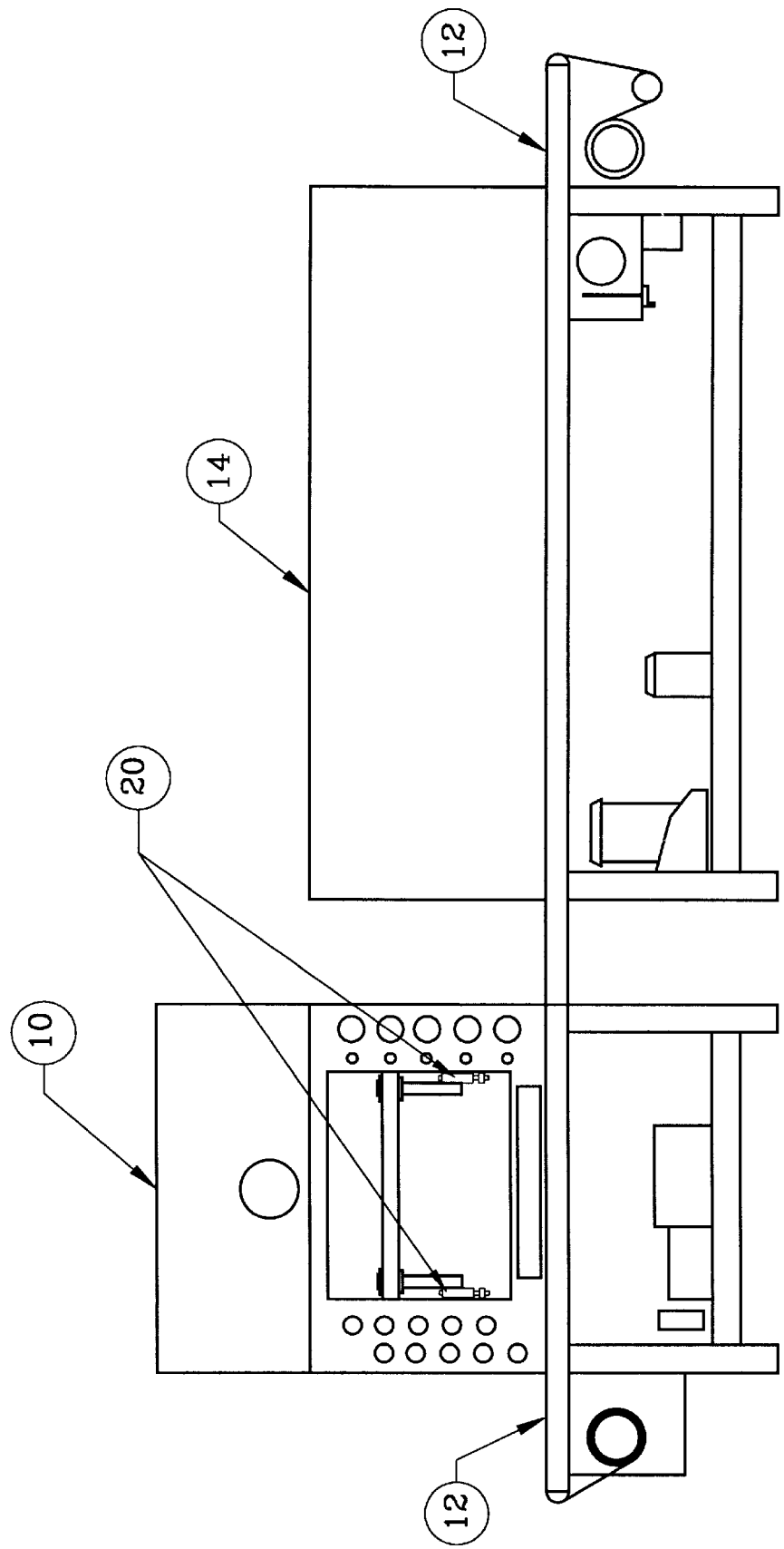
FIG. 2 shows a side view of the preferred embodiment of the invention.

FIG. 2 is a side view of the preferred embodiment of the invention. As in the prior art discussed above, a conveyor belt 12 moves the electronic assemblies through the spraying chamber 10. In this embodiment there are only two spray guns 16 in the chamber which apply the conformal coat/solvent mixture. As the electronic assembly moves out of the spraying chamber 10 there is a gap between the chamber and the oven 14. This space allows the electronic assemblies to be removed from the conveyor belt and run back through the spraying chamber 10. When the conformal coat/solvent mixture is of sufficient thickness, the electronic assemblies are then left on the conveyor 12 to pass through the oven 14.

Figure 3:
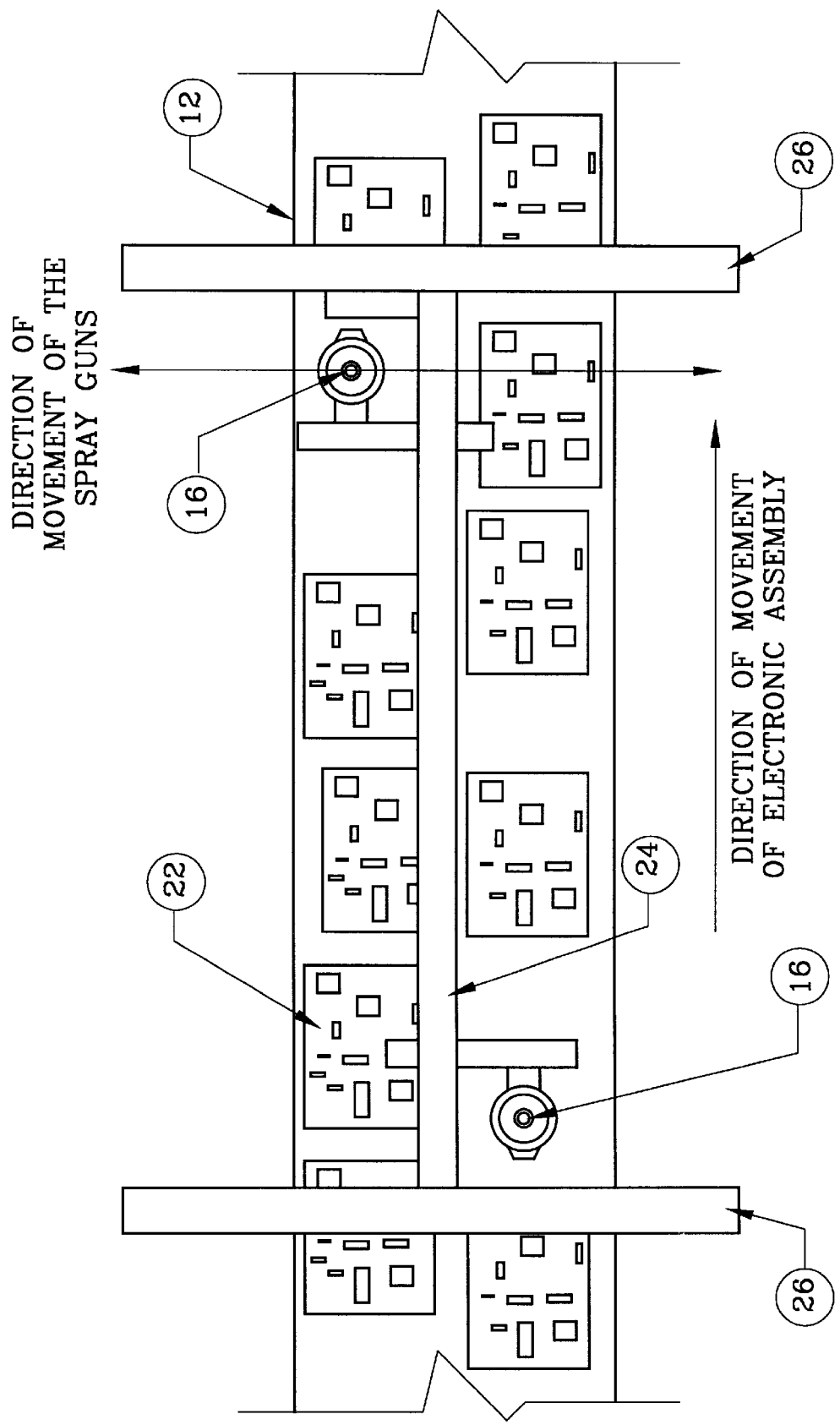
FIG. 3 shows a top view of the conveyor belt and spray guns showing the relative motions of the spray guns in relation to the electronic assembly.

FIG. 3 is a top view of the spraying guns inside the spraying chamber 10. The conveyor belt 12 moves the electronic assembly in a direction so it passes beneath both of the spray guns 16. The spray guns 16 are mounted on a moveable support 24 which moves within guides 26. The direction of movement of the guns is perpendicular to the direction of the conveyor belt. The motions of the conveyor belt and spray guns are synchronized such that a coating of uniform thickness is sprayed on the electronic assembly 22 as it passes beneath the moving guns.

Figure 4:
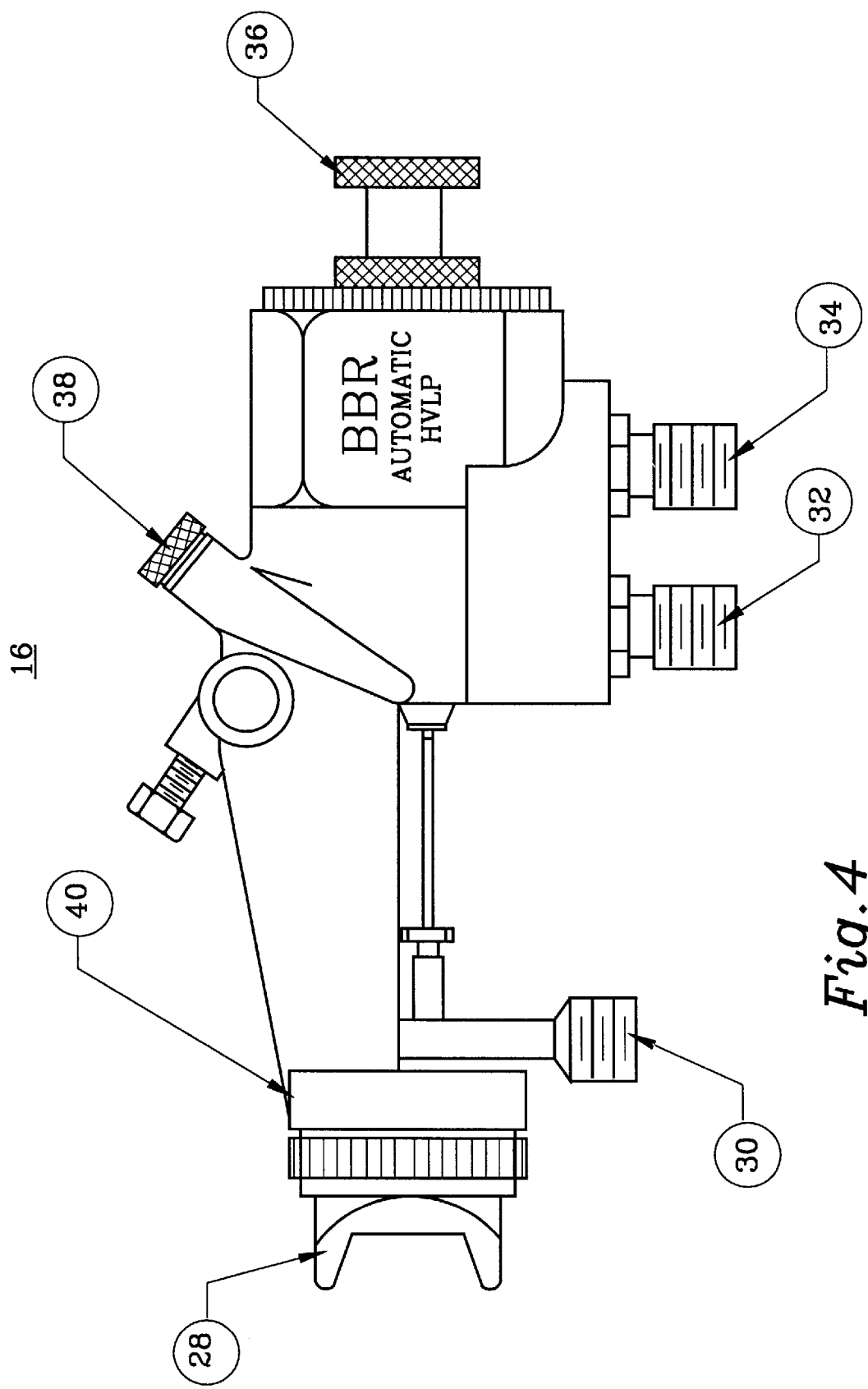
FIG. 4 shows a side view of the low volume/low pressure spray gun.
Figure 5:
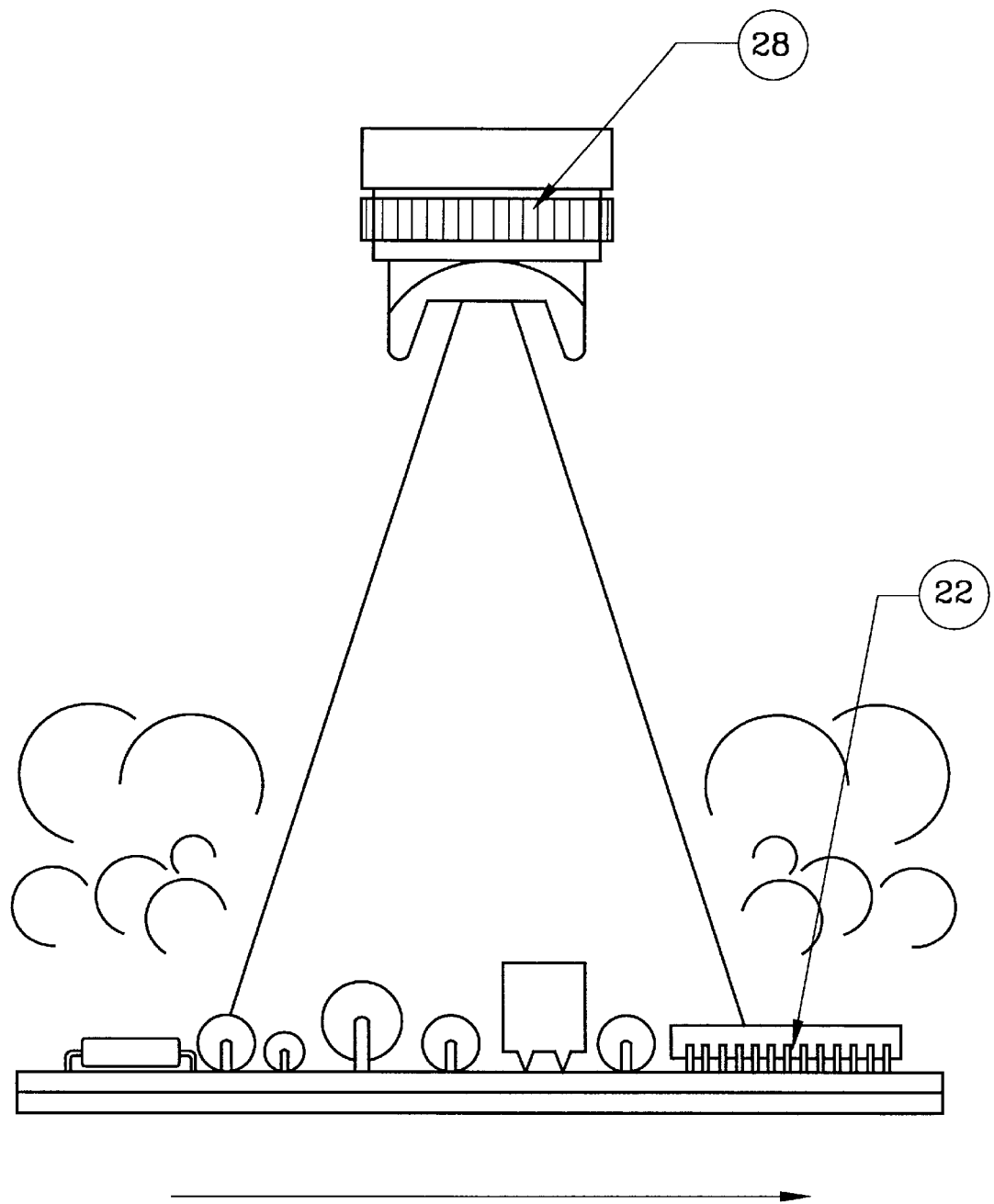
FIG. 5 shows a view of the conformal coat being emitted from the nozzle to the electronic assembly in a fan pattern.

Shown in FIG. 4 is a side view of the spray gun used in the preferred embodiment. This gun is the Binks Mach 1A high volume low pressure (HVLP) automatic spray gun. This gun is made by the Binks Manufacturing Company of 9201 Belmont Avenue, Franklin Park, Ill. In this gun, the conformal coat/solvent mixture enters the gun through inlet 30. The pressurized atomizing air enters the gun through inlet 32 through a ⅜ National Pipe Standard ("NPS") atomizing air line which is larger than the ¼ NPS atomizing air line used in the prior art. A cylinder air inlet 34 also receives pressurized air. Adjustment knob 36 allows the user of the spray gun to adjust the volume and pressure of the fluid which is emitted through nozzle 28 between a particular range. Adjustment knob 38 allows for the adjustment of the width of the fluid fan which is emitted from the nozzle. In this particular gun, the atomizing air is mixed with the fluid from inlet 30 at the chamber 40 where it is atomized at a high pressure. In the preferred embodiment of the invention, the nozzle 28 is of the low volume and low pressure type. With this nozzle the conformal coat/solvent mixture is emitted at a low volume and low pressure and is sprayed directly on the electronic assembly at a pressure of approximately 3 psi. The benefit of using this gun in this particular application is that the conformal coat/solvent mixture is atomized at a sufficiently high pressure, but is then emitted at a low volume, low pressure so as to not cause significant overspray.

During operation of the preferred embodiment, the spray guns are initially aligned relative to the conveyor such that when the electronic assembly passes through not only will the side of the electronic assembly facing the spraying guns be covered, but all the exposed surfaces. This is the reason for having to mount two guns in the chamber. If the purpose of the coating was to merely cover one side of the electronic assembly, only one spray gun is necessary. Once the guns are aligned relative to the conveyor, the electronic assembly is placed on the conveyor belt. The conveyor moves the electronic assembly through the spraying chamber and the spray guns move back and forth over the conveyor.

With the conveyor moving at approximately one foot every ninety seconds, the fluid rate set at 10 cc per minute at each head, and the nozzle atomization pressure set at approximately three psi, the conformal coat/solvent mixture is sprayed upon the electronic assembly. The width of the spray fan pattern for each gun is approximately three to four inches. By the time the entire assembly passes through the spray chamber, a coat of approximately 0.75 mils has been applied. Because of the high solid content in the mixture, the drying process has already begun by the time the electronic assembly leaves the spray chamber such that the assembly can be picked up without causing any damage to the coat that has already been applied. At this point the electronic assembly can then be run back through the spray chamber until a conformal coat of approximately 1.5 mils has been applied. The electronic assembly then can be turned over and run through two more times so that the whole assembly has been coated up to a thickness of 1.5 mils.

After the last pass through the spray booth, the electronic assembly is left on the conveyor and it moves into the curing oven 14. At this point, the electronic assembly is heated so that all the solvent in the mixture is evaporated out, leaving only the conformal coat. Once the electronic assembly leaves the oven 14, the conformal coating process is complete.

In this process, a number of different materials can be used as the conformal coat. These materials include: acrylic resin, epoxy resin, silicone resin, and polyurethane resin. These materials are compatible with the Low Volume Low Pressure ("LVLP")application. The solvent in the preferred embodiment of the invention is toluene. One skilled in the art would realize that in such an application as this, many different kinds of solvents could be used.

FIG. 4 shows a side view of the conformal coat/solvent mixture being applied to the circuit card assembly 22 through low pressure, low volume nozzle 28. In the preferred embodiment of the invention the width of the coat applied by the nozzle is typically between 3 and 4 inches wide.

Because the conformal coat/solvent mixture is sprayed at such a low pressure the transfer rate of the material on to the electronic assembly is very high, typically 80%. The low pressure, low volume nozzle does not encounter the low transfer rate problems of the prior art because there is not significant overspray and the mixture does not rebound significantly from the surface of the electronic assembly. The lack of material rebounding off the electronic assembly significantly reduces the rate of emissions over the prior art. Because more of the mixture sticks to the electronic assembly, the process cycle time for each assembly is significantly reduced. This is mainly due to the fact that although the actual spraying process may move at a slower rate, more of the material sticks to the assemblies. The present process allows for the use of a higher percentage of solids in the conformal coat/solvent mixture. In the preferred embodiment of the invention the percentage of solids is about 12%, where in the prior art it was about 7%. The higher solid percentage allows the assemblies to be handled between the spray chamber and the oven without damaging the conformal coat. The most significant advantages of the present invention are that by using a lesser number of spray guns as a prior art, a conformal coating can be applied to an electronic assembly in the same time or less with significantly lower emissions.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A low-volume low-pressure (LVLP) method of applying a conformal coating to an electronic assembly comprising the steps of:

providing means to support and move the electronic assembly at a predetermined velocity;

atomizing the conformal coating at a predetermined pressure, the conformal coating being comprised of a resin and a solvent solution in a substantially fluid form, without having to be heated to become a fluid, prior to the conformal coating being atomized;

spraying the atomized conformal coating over said electronic assembly at a predetermined low volume and a predetermined low pressure to provide a uniform thickness of the conformal coating over the electronic assembly; and curing the electronic assembly to evaporate the solvent and leave a cured conformal coating, which is comprised substantially of the resin.

2. The method of claim 1 wherein the conformal coating comprises acrylic resin.

3. The method of claim 1 wherein the conformal coating comprises epoxy resin.

4. The method of claim 1 wherein the conformal coating comprises silicone resin.

5. The method of claim 1 wherein the solvent comprises a toluene.

6. The method of claim 1 wherein the step of spraying includes the step of applying the conformal coating to a thickness of 1.5 mils.

7. The method of claim 1 wherein the conformal coating comprises a polyurethane resin.

8. A low-volume low-pressure (LVLP) method of applying a conformal coating to an electronic assembly, the method comprising the steps of:

atomizing the conformal coating at a predetermined pressure, the conformal coating being comprised of a resin and a solvent solution in a substantially fluid form, without having to be heated to become a fluid, prior to the conformal coating being atomized; and spraying the atomized conformal coating over the electronic assembly at a predetermined low volume and a predetermined low pressure to provide a uniform thickness of the conformal coating over the electronic assembly.

9. The method of claim 8, further comprising the step of curing the electronic assembly to remove the solvent and leave a cured conformal coating over the electronic assembly.

10. The method of claim 9, wherein said step of curing comprises the step of heating the electronic assembly.

11. The method of claim 8, wherein the conformal coating is applied at a predetermined fluid rate and at a predetermined pressure.

* * * * *